(12) United States Patent
Ma et al.

(10) Patent No.: US 11,149,343 B2
(45) Date of Patent: Oct. 19, 2021

(54) PROCESSES FOR REFURBISHING A SPENT SPUTTERING TARGET

(71) Applicant: Materion Corporation, Mayfield Heights, OH (US)

(72) Inventors: Longzhou Ma, Las Vegas, NV (US); Xingbo Yang, Phoenix, AZ (US); Matthew J. Komertz, New Fairfield, CT (US); Arthur V. Testanero, New Fairfield, CT (US)

(73) Assignee: Materion Corporation, Mayfield Heights, OH (US)

( * ) Notice: Subject to any disclaimer, the term of this patent is extended or adjusted under 35 U.S.C. 154(b) by 573 days.

(21) Appl. No.: 15/169,455

(22) Filed: May 31, 2016

(65) Prior Publication Data

US 2016/0348231 A1    Dec. 1, 2016

Related U.S. Application Data

(60) Provisional application No. 62/278,549, filed on Jan. 14, 2016, provisional application No. 62/167,718, filed on May 28, 2015, provisional application No. 62/167,734, filed on May 28, 2015.

(51) Int. Cl.
  *C23C 14/34* (2006.01)
  *B22F 3/14* (2006.01)
  (Continued)

(52) U.S. Cl.
  CPC ............ *C23C 14/3414* (2013.01); *B22F 3/14* (2013.01); *B22F 3/24* (2013.01); *H01J 37/3491* (2013.01);
  (Continued)

(58) Field of Classification Search
  CPC ............. B22F 1/0085; B22F 2998/10; B22F 2999/00; B22F 2201/013; B22F 3/04;
  (Continued)

(56) References Cited

U.S. PATENT DOCUMENTS 3,163,910 A * 1/1965 Greene .................. B28B 7/168
                                                              249/52
4,063,702 A * 12/1977 Wilde .................. A47B 95/043
                                                              248/345.1
(Continued)

OTHER PUBLICATIONS

Munir, Z. et al. "The effect of electric field and pressure on the synthesis and consolidation of materials: a review of the spark plasma sintering method." 2006. J Mater Sci. 41. p.763-777. (Year: 2006).*

*Primary Examiner* — Nicholas A Wang
(74) *Attorney, Agent, or Firm* — Cozen O'Connor

(57) ABSTRACT

Processes for refurbishing a spent sputtering target with a non-circular shape are disclosed. In one form, the processes include the steps of receiving one or more spent sputtering targets, inspecting and weighing the spent sputtering targets, removing any contaminants or other surface impurities from the spent sputtering target surfaces, preparing a hot press die with spacers, disposing the spent sputtering targets in the hot press die, the spacers used to center the spent sputtering targets therein, loading fresh metal refilling powder into the die to account for depleted regions of the spent sputtering targets to produce a powder-filled sputtering target, and applying sufficient heat and force to the filled sputtering target to produce a refurbished sputtering target with homogeneous composition and sufficient adhesion strength.

12 Claims, 14 Drawing Sheets

(51) Int. Cl.
*B22F 3/24* (2006.01)
*H01J 37/34* (2006.01)

(52) U.S. Cl.
CPC ..... *B22F 2003/247* (2013.01); *B22F 2301/25* (2013.01); *B22F 2998/10* (2013.01)

(58) Field of Classification Search
CPC .. B22F 3/15; B22F 2003/247; B22F 2301/25; B22F 3/14; B22F 3/24; C23C 14/3414; C22C 1/04; C22C 1/05; C22C 27/00; B29C 33/30; B29C 45/14065; B29C 45/2606; B29C 45/36; B29C 48/327; B29C 2049/4856; B29C 73/105; H01J 37/3491
See application file for complete search history.

(56) References Cited

U.S. PATENT DOCUMENTS

| | | | | |
|---|---|---|---|---|
| 4,470,786 A | * | 9/1984 | Sano | B29C 33/14 257/E21.504 |
| 4,895,998 A | * | 1/1990 | Bevington | H01G 2/04 174/526 |
| 5,218,229 A | * | 6/1993 | Farnworth | H01L 23/49503 257/666 |
| 5,415,584 A | * | 5/1995 | Brooke | B08B 7/00 134/7 |
| 5,439,500 A | * | 8/1995 | Marx | C22C 1/04 204/298.13 |
| 6,450,117 B1 | * | 9/2002 | Murugesh | C23C 16/4402 118/723 ER |
| 7,175,802 B2 | * | 2/2007 | Sandlin | B22F 7/062 204/298.12 |
| 8,460,602 B2 | * | 6/2013 | Yamamoto | C04B 35/645 204/298.12 |
| 2009/0022616 A1 | * | 1/2009 | Acker | B22F 7/062 419/48 |
| 2010/0170786 A1 | * | 7/2010 | Wang | B22F 3/12 204/298.13 |
| 2011/0176951 A1 | * | 7/2011 | Beister | B22F 3/1035 419/28 |
| 2013/0154146 A1 | * | 6/2013 | Adachi | B29C 67/04 264/40.3 |

* cited by examiner

PROCESSES FOR REFURBISHING A SPENT SPUTTERING TARGET

CROSS-REFERENCE TO RELATED APPLICATIONS

This application claims priority to U.S. Provisional Patent Application Ser. No. 62/167,718, filed on May 28, 2015, and to U.S. Provisional Patent Application Ser. No. 62/167,734, filed on May 28, 2015, and to U.S. Provisional Patent Application Ser. No. 62/278,549, filed on Jan. 14, 2016. The disclosures of these applications are hereby fully incorporated by reference in their entirety.

BACKGROUND

Sputtering is a process used to deposit a thin layer of material onto a substrate. The sputtering target, typically a metal or metal alloy, is constructed of the material to be sputtered. The sputtering target and the substrate are placed in proximity to one another within the chamber and the target is bombarded with charged particles or ions. The high energy ions cause a portion of the sputtering target to dislodge and be re-deposited on the substrate.

Unfortunately, the sputtering target is usually not uniformly consumed. The metal is more easily dislodged from the sputtering target in those regions where the ionization is most intense. This generates a localized erosion groove (i.e. depleted region), where the sputtering target eventually wears thin and depletion grooves form. Due to the non-uniform consumption of the metal, the sputtering target often reaches the end of its useful life after only a small fraction (approximately 30%) of the metal has been consumed. Normally, the spent sputtering target is then discarded, re-melted, or refined. However, refining the spent sputtering target, in particular when the target is made of a precious metal, is complex and increases the cost for making a whole new sputtering target.

It would be desirable to be able to refill the eroded portion of a spent precious metal sputtering target, which uses much less material than building a brand new sputtering target. In this way there will be a significant cost reduction through increasing end-to-end material yields, in addition to reducing the carrying cost of precious metal inventory.

BRIEF DESCRIPTION

The present disclosure relates generally to a process for refurbishing (refill) a non-circular spent sputtering target. The non-circular spent sputtering target may be refurbished by re-processing the un-sputtered leftover metal, combining it with fresh metal powder that has the same composition as the un-sputtered metal of the sputtering target, or potentially a different composition, and reforming a new sputtering target therefrom. In particular, effective cleaning methods are used to remove contaminants from the sputtered target. Such contamination can affect the adhesion strength, machining ability, and density of the refurbished sputtering target. Also, unique toolset designs as well as sintering procedures with combinations of pressure and temperature are used to accommodate the an isotropic thermal expansion caused by the non-circular sputtering target. Furthermore, in some particular embodiments, spacers provide successful refurbishing via hot pressing without damaging the toolset due to anisotropic thermal expansion of the spent sputtering target. The spacers are used to ensure the spent target is located in the center of the die with an equal gap between the spent target and the die wall on all sides.

Disclosed in various embodiments herein are processes for refurbishing a non-circular spent sputtering target, comprising: receiving a non-circular spent sputtering target having a shaped erosion profile on a sputtering surface (i.e. top surface) and a back surface opposite the depleted region (which may be flat); optionally cleaning the sputtering surface of the spent target; preparing a hot press die having a bottom punch and a die wall surrounding a cavity capable of accommodating the spent sputtering target; centering the spent sputtering target within the cavity of the hot press die to accommodate anisotropic thermal expansion; filling the eroded region of the spent sputtering target and the gaps between the spent sputtering target and the die wall with a metal powder to produce a re-filled sputtering target; and applying sufficient heat and force to a top surface of the powder-filled spent sputtering target while maintaining the temperature below that of the melting point of the metal to consolidate the metal powder together with the spent sputtering target through a solid state diffusion process, thus producing a refurbished sputtering target.

Some processes further comprise inspecting the spent sputtering target to determine its weight, either before or after preparing the hot press die, and identifying a desired weight that corresponds to the weight of the spent sputtering target in its original form. In some particular embodiments, the total weight of the metal powder and the spent sputtering target are substantially equal to the desired weight after filling the depleted region of the spent sputtering target, the gaps between the spent sputtering target and the die wall, and the spacer gap with the metal powder.

Some process can comprise using a reactive gas to clean the spent sputtering target, or using a mechanical cleaning treatment to clean the sputtered surface of the spent target. In some particular embodiments, a mechanical cleaning treatment is used to clean the spent sputtering target, including grinding, sanding, wiping, dry ice blasting, or a hot air gun.

In some particular embodiments, the cavity of the hot press die is circular, and insert pieces are placed within the cavity of the hot press die to change the perimeter of the cavity into a non-circular shape corresponding to the shape of the spent sputtering target. Each insert piece can comprise a curved sidewall and a linear sidewall.

In some embodiments, the processes further comprise placing a foil between the spent sputtering target and the bottom wall of the hot press die.

The metal powder can be selected from a metal selected from the group consisting of platinum, rhodium, and ruthenium. In some embodiments, the metal powder includes an alloy of at least two different metals, at least one of which is selected from platinum, rhodium, and ruthenium Hot pressing can be performed by applying a uniaxial force to the top surface of the powder-filled sputtering target using a top punch and further comprising placing a foil between the top surface of the spent sputtering target and the top punch prior to applying the uniaxial force.

The step of applying sufficient heat and force can be performed for a time period sufficient to sinter the metal powder and form a solid state diffusion bond with the spent sputtering target, with a similar microstructure at the interface between the spent sputtering target and the sintered metal powder as found elsewhere in the refurbished sputtering target.

A heat from about 1300° C. to about 1550° C. and a uniaxial force of from about 10 MPa to about 40 MPa may be applied in a direction perpendicular to the top surface of the filled Ru sputtering target.

Some processes further comprise using at least one spacer to center the spent sputtering target within the cavity to accommodate anisotropic thermal expansion and removing the at least one spacer and filling a spacer gap with the metal powder to produce the filled sputtering target. A plurality of spacers can be used to center the spent sputtering target within the cavity.

Also disclosed in various embodiments herein are refurbished sputtering targets made by a process comprising: receiving a non-circular spent sputtering target having an eroded groove on a sputtering side and a flat back side opposite the erosion groove; cleaning the sputtered side of the spent sputtering target by a mechanical cleaning treatment to remove contaminants or surface impurities; preparing a hot press die having a bottom wall and a die wall surrounding a cavity capable of accommodating the spent sputtering target; centering the spent sputtering target within the cavity of the hot press die to accommodate anisotropic thermal expansion; baking the metal powder; filling the eroded groove of the spent sputtering target and the gaps between the spent sputtering target and the die wall with the metal powder to produce a filled sputtering target; and applying sufficient heat and force to a top surface of the filled sputtering target while maintaining the temperature below that of the melting point of the metal to hot press the filled sputtering target such that the metal powder bonds with the un-sputtered metal through solid state diffusion process, thus producing a homogenous refurbished sputtering target.

Other various embodiments disclosed herein relate to refurbished sputtering targets made by a process comprising: receiving a non-circular spent sputtering target having a sputtering eroded groove on a sputtering side of the spent target and a back surface opposite the sputtering side; preparing a hot press die having a bottom wall and a die wall surrounding a cavity capable of accommodating the spent sputtering target; disposing the spent sputtering target within the cavity of the hot press die, using at least one spacer to center the spent sputtering target within the cavity to accommodate anisotropic thermal expansion; filling the sputtering eroded groove of the spent sputtering target and the gaps between the spent sputtering target and the die wall with a metal powder; removing the at least one spacer and filling a spacer gap with the metal powder to produce a filled sputtering target; and applying sufficient heat and force to a top surface of the filled sputtering target while maintaining the temperature below that of the melting point of the metal to hot press the filled sputtering target such that the metal powder bonds with the un-sputtered metal through solid state diffusion process, thus producing a homogenous refurbished sputtering target.

Disclosed in some various embodiments herein are kits for refurbishing a non-circular spent sputtering target, comprising: a hot press die having a bottom wall and a die wall surrounding a cavity; and at least one spacer.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
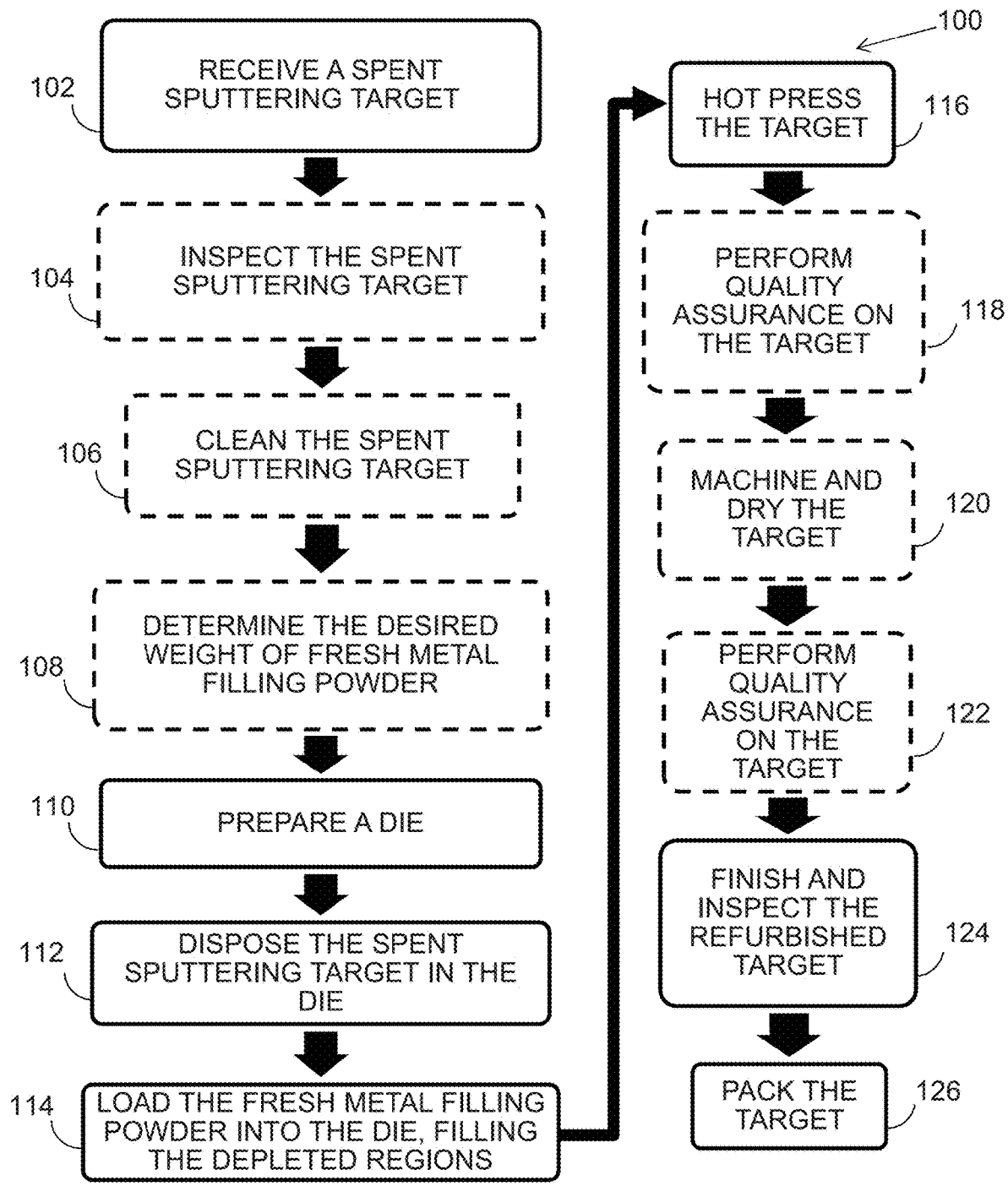
FIG. 1 is a flow diagram of one process of the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named ingredients/steps and permit the presence of other ingredients/steps. However, such description should be construed as also describing compositions or processes as "consisting of" and "consisting essentially of" the enumerated ingredients/steps, which allows the presence of only the named ingredients/steps, along with any impurities that might result therefrom, and excludes other ingredients/steps.

Numerical values in the specification and claims of this application should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently combinable (for example, the range of "from 2 grams to 10 grams" is inclusive of the endpoints, 2 grams and 10 grams, and all the intermediate values).

The terms "about" and "approximately" can be used to include any numerical value that can vary without changing the basic function of that value. When used with a range, "about" and "approximately" also disclose the range defined by the absolute values of the two endpoints, e.g. "about 2 to about 4" also discloses the range "from 2 to 4." Generally, the terms "about" and "approximately" may refer to plus or minus 10% of the indicated number.

The present disclosure may relate to materials or powders comprising particulates having an average particle size. The average particle size is defined as the particle diameter at which a cumulative percentage of 50% (by volume) of the total number of particles are attained. In other words, 50% of the particles have a diameter above the average particle size, and 50% of the particles have a diameter below the average particle size. The size distribution of the particles will be Gaussian, with upper and lower quartiles at 25% and 75% of the stated average particle size, and all particles being less than 150% of the stated average particle size.

The present disclosure may refer to temperatures for certain process steps. It is noted that these generally refer to the temperature at which the heat source (e.g. furnace, oven) is set, and do not necessarily refer to the temperature which must be attained by the material being exposed to the heat. The term "room temperature" refers to a range of from 20° C. to 25° C.

Figure 2A:
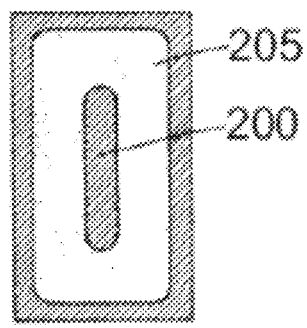
FIG. 2A shows a plan view.
Figure 2B:
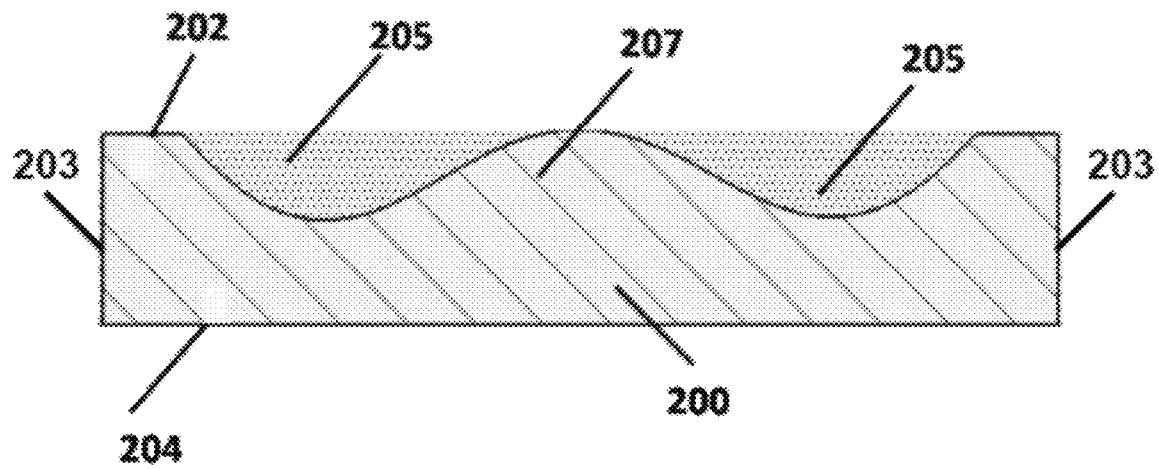
FIG. 2B shows a cross-sectional view, of a non-circular sputtering target for use with the presently disclosed processes.

The present disclosure relates to a process for refurbishing a non-circular spent sputtering target. In more specific embodiments, the non-circular sputtering targets have a rectangular or square shape. This shape is determined by the perimeter of the top surface of the sputtering target, which is contacted by the ion beam during use. FIG. 2A is a plan view of the top surface of a rectangular spent sputtering target 200, and FIG. 2B is a side cross-sectional view of the rectangular spent sputtering target. The sputtering target has a top surface 202 and a bottom surface 204 and sidewalls 203 extending between the top surface 202 and the bottom surface 204. Depleted regions 205 (i.e. a sputtering-eroded groove) are visible in the top surface 202. These depleted regions are usually non-uniform. Non-depleted regions of the top surface are labeled with reference numeral 207.

Now, referring to FIG. 1, a process for refurbishing a spent sputtering target 100 commences with step 102, wherein one or more spent sputtering targets is received. The spent sputtering targets may be received from, for example, a target recycling facility. It is specifically contemplated that in some embodiments described herein, a plurality of spent sputtering targets are processed simultaneously.

Once the spent sputtering target has been received in step 102, the spent sputtering target is inspected 104. This may include marking the spent sputtering target with, for instance, a part or batch number. Step 104 can also include identifying the actual weight of the spent sputtering target.

Sputtered targets often contain surface impurities or other contaminations which can be organic or metallic in nature. The source of impurities can be, for instance, flake-off from a shield kit of the sputtering chamber; bonding adhesive if the sputtering target is bonded to a backing plate; reaction products due to vacuum leak; or re-deposition back onto the target itself from the substrate, etc. The surface contamination of a spent sputtering target affects the bonding strength, machinability, and density of a refurbished target, all which may cause damage to the hot pressing die, de-lamination, cracking during machining in the next step, or falling apart of the refurbished target during subsequent sputtering. It is therefore desirable to clean the spent sputtering target to remove contaminants and other surface impurities before refurbishing processes. Step 106 includes cleaning the spent sputtering target to ensure removal of those possible surface impurities from the sputtered surface of the spent target, and is performed if needed or desired. More specifically, step 106 includes removing contamination and surface impurities from the spent sputtering targets by different procedures depending on the nature of impurities or contamination. In this disclosure, the cleaning procedures can include: 1) mechanical treatment such grinding, milling, or dry ice ($CO_2$) blasting to remove the contaminants/impurities; and 2) reactive treatment by bleeding a reactive gas, such as $H_2$, and/or high vacuum upon the surface of the sputtering target to trigger a reduction reaction at elevated temperatures for an appropriate duration. In this regard, the inventors have found that utilizing a $H_2$ reduction reaction method at a temperature from about 1300° C. to about 1550° C. for a period of about 3 hours to about 4 hours has been shown to sufficiently remove contaminants and other surface impurities from the set of spent sputtering targets such as Ru. Other conventional cleaning methods can also be used to accomplish step 106, such as, for instance, wet or dry cleaning, sand blasting, dry ice blasting, or other suitable blasting procedures using a variety of different media.

In particular embodiments, the mechanical cleaning procedure includes air-driven dremel grinding with a coated grinding wheel to remove contamination and nodules from the surface of the spent sputtering target. The wheel coating can be any suitable abrasive material, such as a diamond abrasive media, and the grinding wheel can have any desired diameter including a diameter of about 1.0 inch. After dremel grinding, orbital sanding is used to clean the entire surface of the spent target. Orbital sanding can be performed with any suitable sanding paper, such as No. 60 silica sanding paper, for example. Methanol wiping can optionally be performed after orbital sanding. After dremel grinding and orbital sanding, dry ice blasting is conducted to remove residual contamination and dust or dirt that may be embedded in porous regions of the spent target sputtering surface. After dry ice blasting, a hot air gun can be used at a temperature of about 200° C. to about 300° C. to remove moisture from the spent target surface. After dry ice blasting and hot air gun de-moisture, an X-ray fluorescence (XRF) gun can be used to ensure contamination has been adequately removed.

Finally, step 106 can include confirming the effectiveness of the cleaning procedure by visually inspecting the set of spent sputtering targets, ensuring that discolor on the surface of the spent sputtering targets have been removed. Alternatively, confirmation of the effectiveness of the cleaning procedure can be confirmed by using a high resolution Scanning Electron Microscope equipped with an EDX (energy dispersive X-ray) spectroscopy detector for metallic impurities and a Raman spectroscope for organic impurities.

Next, in step 108, which is also optional, the weight of fresh metal refilling powder that is desired is determined. The desired amount is calculated by determining the difference between the weight of the original sputtering target and the weight of the spent sputtering target. For example, if the desired weight of the recycled target is defined as X grams (e.g. 10 grams), but the actual weight of the spent target is X-Y grams (e.g. 8 grams), then an additional Y grams (e.g. 2 grams) of metal should be added to refurbish the spent sputtering target.

Figure 3:
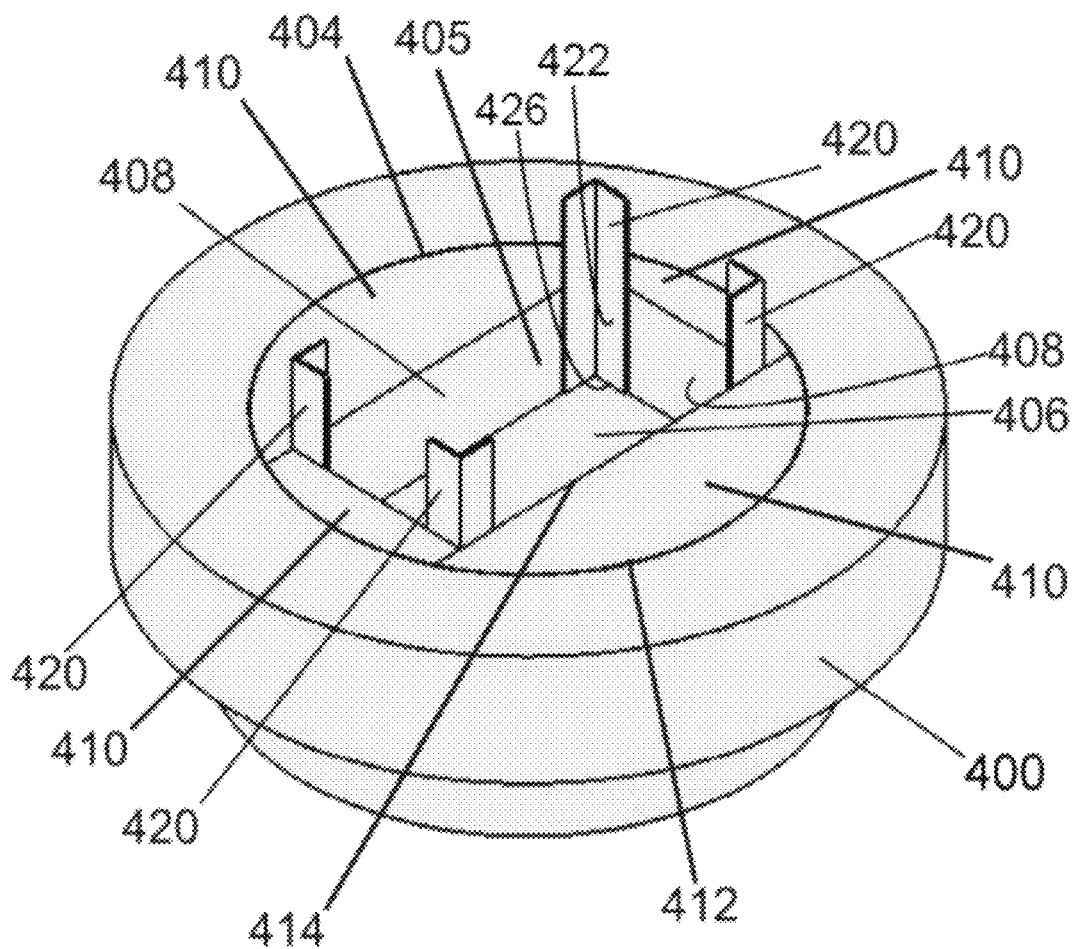
FIG. 3 depicts a circular die that has been modified for refurbishing a rectangular sputtering target. The original circular die contains a circular cavity. Four insert pieces are placed within the circular cavity to change the shape of the cavity into a rectangular shape. Four spacers are placed in the corners of the rectangular cavity to center the spent sputtering target.

In step 110, the die is prepared to receive the spent sputtering target. FIG. 3 is a perspective view of the die 400, after preparation has been completed. The die 400 is illustrated here as having a circular shape, a circular die wall 404, and a bottom wall 406 on which the bottom surface of the sputtering target rests. This die 400 is useful for circular sputtering targets, and can be modified for non-circular sputtering targets. The circular die wall 404 and the bottom wall 406 define a cavity 405 into which the spent sputtering target will be placed. The size and shape of the cavity 405 is desirably configured to securely mate with the spent sputtering target. Initially, insert pieces 410 are inserted into the cavity 405 to form a new non-circular die wall 408, which is depicted here with a rectangular shape. Here, four insert pieces are used to form the new non-circular die wall. Each insert piece 410 has a curved sidewall 412 and a linear sidewall 414. Spacers 420 are then inserted into the cavity 405 to space the sputtering target from the die wall 408. Four spacers are depicted here, though one spacer alone can be sufficient, and using only two spacers at opposite ends of the cavity is also specifically contemplated. The number of insert walls 410 and spacers 420 may be quickly and easily varied to accommodate any target shape. Put another way, many other suitable configurations of the insert walls and spacers would be apparent to one skilled in the art after benefiting from reading this disclosure. Such configurations are considered within the scope of this disclosure. Generally, the spacers are made of stainless steel, though other suitable compositions are contemplated.

The insert pieces and the die 400 may be constructed of any suitable material capable of withstanding the applied forces and high temperatures to which it will be subjected. For example, die 400 may be constructed of graphite. In one embodiment, the graphite is a high grade graphite. High grade graphite is generally characterized by low porosity and fine grain size. The die may be cut from a block of suitable graphite using well known lathe machinery.

Figure 4:
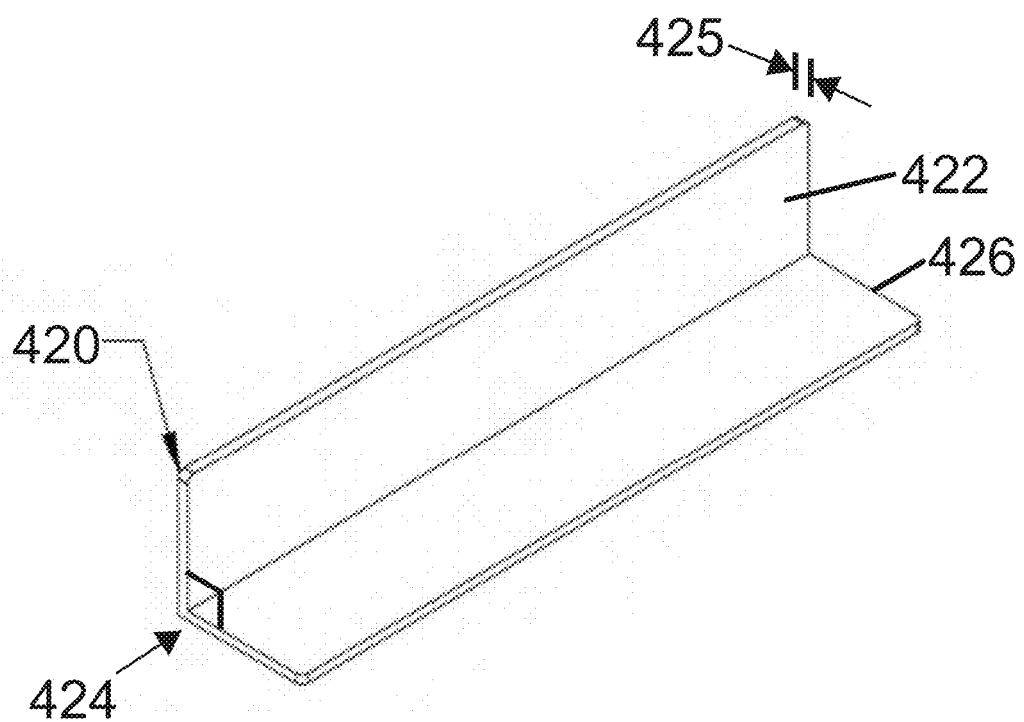
FIG. 4 is a perspective view of a spacer used in the non-circular cavity of FIG. 3.

FIG. 4 is a perspective view of a spacer 420. The spacer is formed from a sidewall 422 that has a constant thickness 425. The spacer is shaped to center the spent sputtering target within the cavity of the die. Here, for a rectangular sputtering target, the spacer includes a right angle 424. One end 426 of the spacer 420 will engage the bottom wall of the cavity of the die. The sidewall 422 and end 426 are also labeled in FIG. 3.

Step 110 of preparing the die may also include inserting a foil, made of graphite or molybdenum, on the bottom punch 406 of the non-circular cavity. This foil helps to prevent diffusion of material from the die 400 or protect the die and the bottom punch from wearing, chipping, or eroding when force is applied. This step 110 may also include spraying or otherwise coating the insert pieces and spacers of the die with any chemical composition suitable for high-temperature applications, such as a Boron Nitride (BN) spray. The inventors have found such a BN spray coating to be both non-reactive and non-stick, making it a highly advantageous use for hot-pressing.

It should be understood that because steps 104, 106, and 108 are optional, these steps can be performed, if at all, in any desirable order. The order shown in the flow chart of FIG. 1 is to be understood as being merely exemplary of one such order. In particular, those steps of preparing the spent sputtering target can be performed in any order before or after step 110 of preparing the die.

Figure 5:
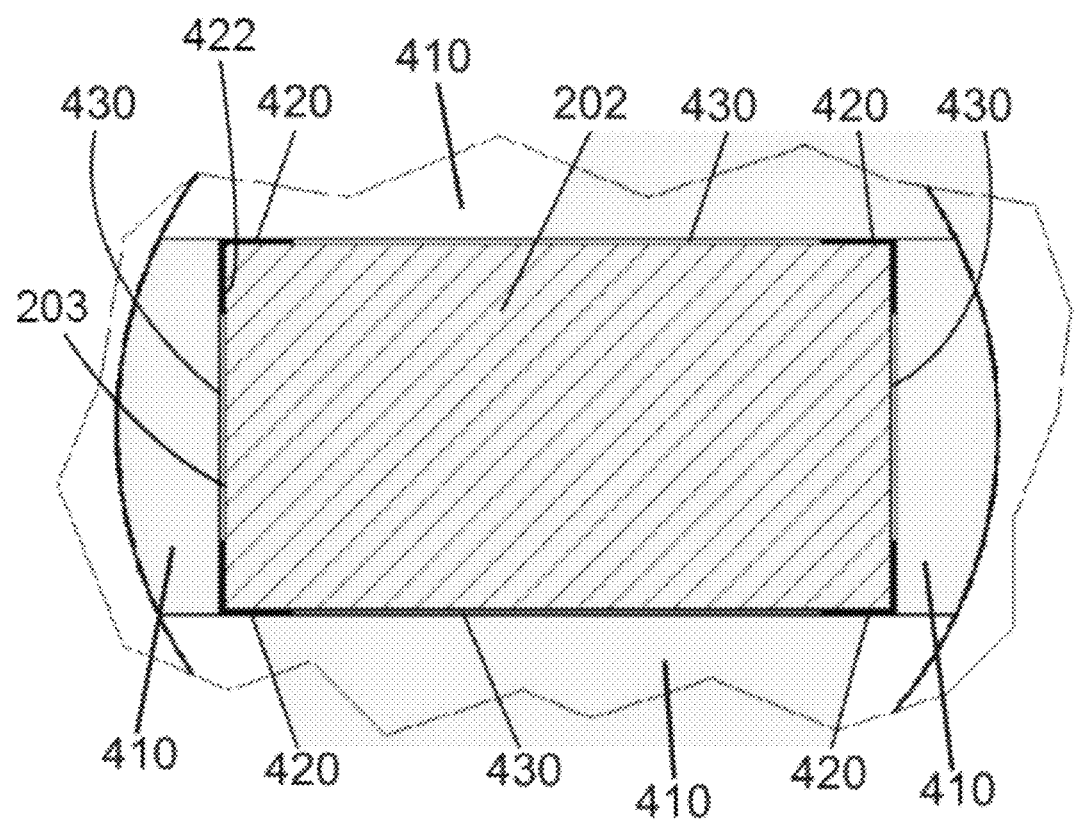
FIG. 5 is a top view of the die of FIG. 3 with the rectangular spent sputtering target placed within the rectangular cavity (no metal powder added yet). Also visible are gaps between the spent sputtering target and the rectangular die wall formed by the insert pieces.

In step 112, the spent sputtering target is disposed within the hot press die. FIG. 5 is a top view of the hot press die with the spent sputtering target placed therein. The four insert pieces 410 defining the non-circular shape of the cavity are visible, as are the four spacers 420 with their sidewalls 422 shown on-edge, and the top surface 202 of the spent sputtering target with its sidewalls 203 shown on-edge. Due to the presence of the spacers, there are gaps between the spent sputtering target and the die wall (formed by the insert pieces 410), which are indicated with reference numeral 430. In this regard, it is noted that non-circular sputtering targets will thermally expand in an anisotropic fashion in both longitudinal and transverse directions during hot pressing. The use of the spacers permits the spent sputtering target to be well aligned in the cavity so that such expansion occurs in the longitudinal and transverse directions without damaging the hot press die and related toolset. Any undesirable oxidizing gases, such as atmospheric oxygen, may be purged by passing an inert gas (such as argon) over the assembly.

Next, step 114 is executed, in which the depleted regions 205 of the spent sputtering target 200 (see FIG. 2B) are filled with the fresh metal powders 304. The metal powder can have the same composition as, or a different composition from, the spent sputtering target 200, though it is typically desirable to use a metal powder having the same composition. For example, if the spent sputtering target 200 is comprised of ruthenium, the depleted regions 202 are typically filled with fresh ruthenium powder. In addition, referring back to FIG. 5, the gaps 430 are also filled with the metal powder.

Many different suitable metals, metal-alloys, and combinations of metal-alloys and oxide ceramics may be used. Exemplary suitable materials for use with the presently disclosed processes may include, but are not limited to, ruthenium and its alloys, and other precious metals as well.

In some embodiments, the metal/metal-alloy is free of both oxides and carbides. The "virgin" or "fresh" metal powder may be of various morphologies, provided that the particulates have a suitable particle size and purity. In one aspect, the particle morphology is fibrous or flake-like. In such an embodiment, acicular or round morphologies are avoided. One suitable metal powder has a tap density of from approximately 2.5 to about 3.2 g/cc and the particles have a surface area of from approximately 0.1 to about 0.4 square meters per gram. The powder is preferably at least 99.95% pure and does not contain any of the following elemental impurities: Ag, Al, Co, Cr, Cu, Fe, Mg, Mo, Ni, Si, Sn, Ti, Zn and Zr. The combined concentration of the aforementioned elements is preferably less than 500 ppm.

Prior to being used to fill the depleted region(s) of the spent sputtering target, the metal powders, especially precious metal powders such as ruthenium, iridium or rhodium, should be baked and desorbed in vacuum, inert gas, or reductive gas with proper temperatures ranging from 200° C. to 1100° C. for a sufficient time period to remove moisture, and enhance the flowability and purity of the powder.

In the case of a combination of metal-alloys and oxides, the oxide(s) must be distributed homogeneously throughout in the final microstructure (particle size <5 microns) being in equilibrium with the surrounding gas atomized metal-alloy counterpart (particle size <45 microns). The starting fresh metal filling powder is preferably at least 99.9% pure based on the following elemental impurities: Ag, Al, Co, Cr, Cu, Fe, Mg, Mo, Ni, Si, Sn, Ti, Zn and Zr.

The metal powder is loaded into the die 400 with the spacers 420 still remaining in the die 400. In loading the metal powder, powder is loaded to fill the gaps 430 between the spent sputtering target and the die. The spacers 420 are then removed from the die 400, which may leave what are termed "spacer gaps" in their former location. The metal powder is then loaded into these spacer gaps as well. After these gaps are filled with powder, the depleted region(s) of the sputtering target is filled with powder, and the powder is then leveled to obtain a powder-filled sputtering target (also referred to herein simply as a filled sputtering target).

Figure 6:
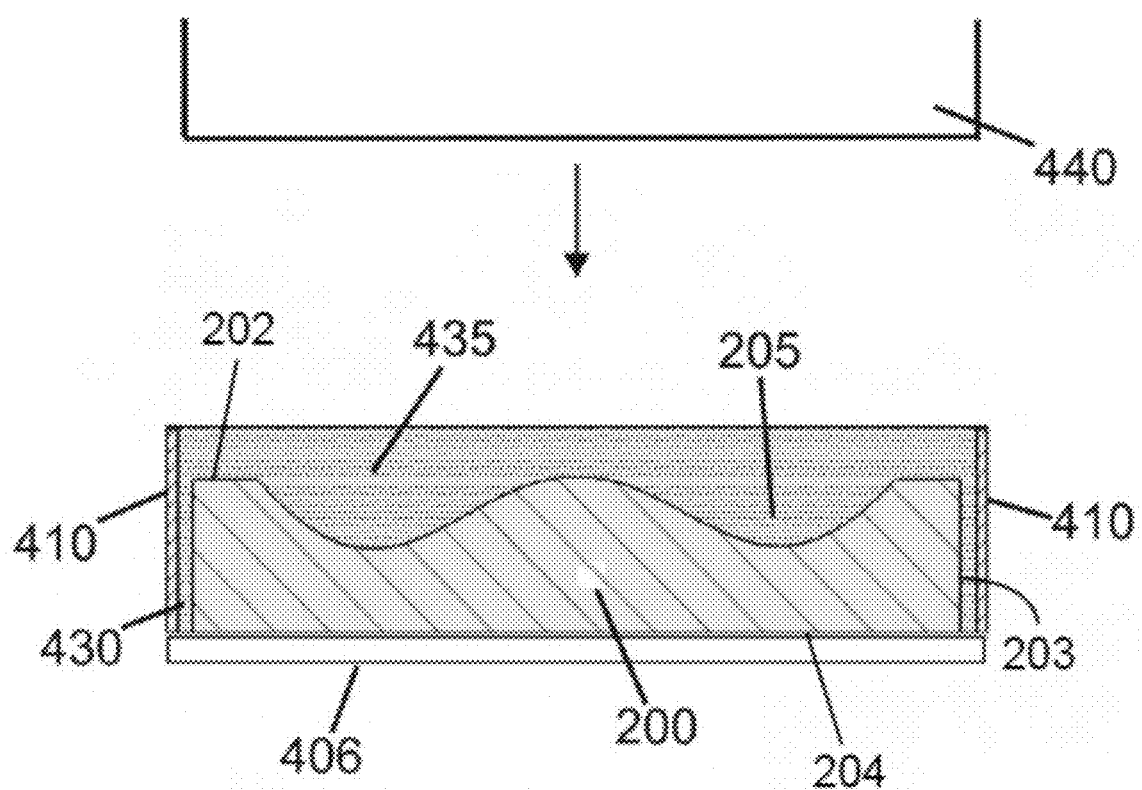
FIG. 6 is a side cross-sectional view showing the spent sputtering target, the insert pieces, and the fresh metal powder within the hot press die prior to hot pressing. Also shown is a top punch.

FIG. 6 is a side cross-sectional view showing the resulting filled sputtering target 200 centered between the insert pieces 410. The top surface 202, bottom surface 204, and sidewalls 203 extending between the top surface 202 and the bottom surface 204 are also labeled. Powder 435 surrounds the target 200 in the gaps 430, and also fills the depleted regions 205. The powder is shown as completely covering the sputtering target 200, including non-depleted region 207.

Next, a thick (approximately 0.03 inches to 0.04 inches) foil can be applied to the top of the die, or to the top punch, i.e. inserted between the powder-filled sputtering target and the top punch. As with the thin foil on the bottom wall of the die, such foil helps to prevent diffusion of material (such as carbon atoms from the graphite) from wearing, chipping or eroding during hot pressing.

Referring again to FIG. 1, once the sputtering target has been securely disposed in the die (step 112) and the depleted regions are covered with fresh powder (step 114), step 116 is executed, wherein the filled sputtering target is hot pressed such that the powdered metal fuses with the un-sputtered metal, producing a refurbished sputtering target. In some embodiments, the powdered metal can be bonded with the spent sputtering target via solid state diffusion to produce the refurbished sputtering target. The process of hot pressing is conducted to bond the fresh metal powder 435 and previously spent target 200 together.

Referring back to FIG. 5, a top punch 440 is used to apply a uniaxial force in a direction perpendicular to the top surface of the spent sputtering target to compress the sputtering target between the top punch 440 and the bottom wall 406 of the die. When the axial force is applied, the die wall experiences radial stress. The insert pieces 410 and the die wall 404 are thick enough to accommodate this radial stress.

During the hot pressing step 116, both heat and pressure are applied for a certain period of time. This hot pressing technique can be distinguished from hot isostatic pressing (HIPing) by the direction of force. Isostatic pressure is omnidirectional and subjects the target to a very different pressurized environment than axial pressure. In particular, much lower pressures can be used compared to HIPing and still produce a homogeneous refurbished sputtering target. Subsequent sawing, milling, or grinding of the refurbished target may be needed to obtain the desired final shape.

The amount of heat, the amount of pressure, and the length of time varies depending on the composition of the sputtering target. The powder-filled sputtering target is heated to a specified temperature, typically from approximately 1300° C. to 1550° C. for ruthenium. Excessively low temperatures are characterized by insufficient diffusion to produce a homogenous target, while excessively high temperatures are characterized by anomalous grain growth and undesirable magnetic properties which also produces an inhomogeneous target Upon the completion of step 116, the metallurgically refurbished dense sputtering target has been created. The refurbished sputtering target is substantially homogeneous, such that minimum void space is present in the interface between the old spent target (i.e. the base area) and the metal powder (i.e., the refilled area). This can be observed either by optical microscopy or by scanning electron microscopy. The refurbished sputtering target may have a relative density (RD) of up to 97% of theoretical max, and the die and tools to make the refurbished target are intact instead of damaged by the process.

With reference to FIG. 1, additional, optional steps may be desired to complete processing of the sputtering target. Step 118 includes the performance of quality assurance on the hot-pressed refurbished target. Generally, step 118 may include unloading the refurbished sputtering target after the hot pressing step 116 and inspecting the target. The weight and density of the target may be calculated and checked, and a flexural strength test for adhesion, density, and cross-section may be performed. If the target is not of sufficient density (generally <95%), the target may be scrapped and re-pressed by beginning the process again.

In step 120, the refurbished sputtering target may be machined and grinded to the desired dimensions. Generally, machining and grinding of the refilled side (i.e. top surface) of the refurbished sputtering target is kept to a minimum, instead performing all desired machining and grinding, to the extent possible, to the base side (i.e. bottom surface) of the refurbished sputtering target.

Once the target has been machined quality assurance may be performed on the target to ensure these steps did not affect the final product. The quality assurance of step 122 generally includes inspecting the machined and dried target, using calipers to ensure the target has been machined to the desired size.

In step 124, the refurbished sputtering target may be further finished and inspected. The finishing can include a final cleaning of the refurbished target.

Finally, the refurbished sputtering target may be packed in step 126, such, for instance, by using a vacuum sealer and label XFR gun as a final check of the refurbished target.

It is to be understood that because steps 118, 120, 122, 124, and 126 are optional, these steps can be performed, if at all, in any desirable order. The order shown in the flow chart of FIG. 1 is to be understood as being merely exemplary of one such order.

The following examples are provided to illustrate the processes of the present disclosure. The examples are merely illustrative and are not intended to limit the disclosure to the materials, conditions, or process parameters set forth therein.

EXAMPLES

The following examples present a detailed procedure for making a refurbished sputtering target. These examples are illustrative only, and are not intended to limit the scope of the present disclosure.

Example 1

Two non-circular spent ruthenium sputtering targets with rectangular shape as seen in FIG. 2 were used as studying examples. Each spent target was cleaned by a reduction treatment procedure at elevated temperature up to 1400° C. The spent target was refurbished by hot pressing. Following the procedure described above, a spent target was loaded into a die cavity, and fresh ruthenium powder was loaded accordingly, and then hot pressing was conducted. During hot pressing, the temperature ranged from 1300° C. to 1500° C., the uniaxial pressure ranged from 30 MPa to 40 MPa, and the hot pressing time ranged from 5 hours to 7 hours. Depending on hot pressing parameters, the refurbished sputtering targets achieved different relative densities (RD) ranging from 97.3% to 99.5%, which indicates the relative density of a refurbished target can be tuned via changing hot pressing parameters. The refurbished sputtering targets were characterized by microstructure, EDX (energy-dispersive X-ray) spectroscopy, and mechanical property to examine the manufacturing quality.

Figure 7A:
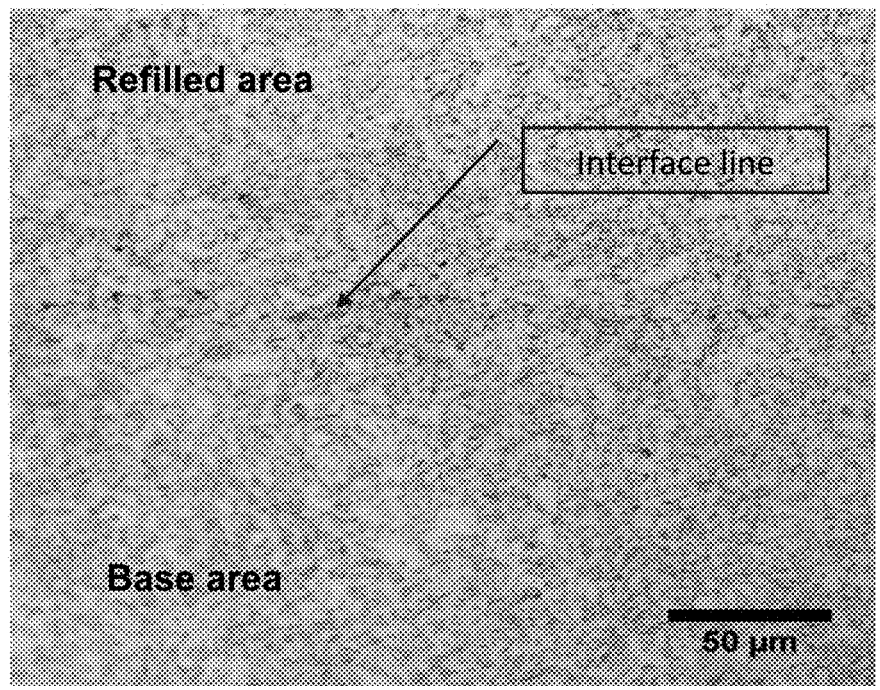
FIG. 7A and FIG. 7B are optical microstructure micrographs of cross-section samples from refurbished ruthenium (Ru) sputtering targets with relative density (RD) 99.5 and 97.3%, respectively. The refilled area is formed from the metal powder that has been added, and the base area is formed from the original spent sputtering target.
Figure 7B:
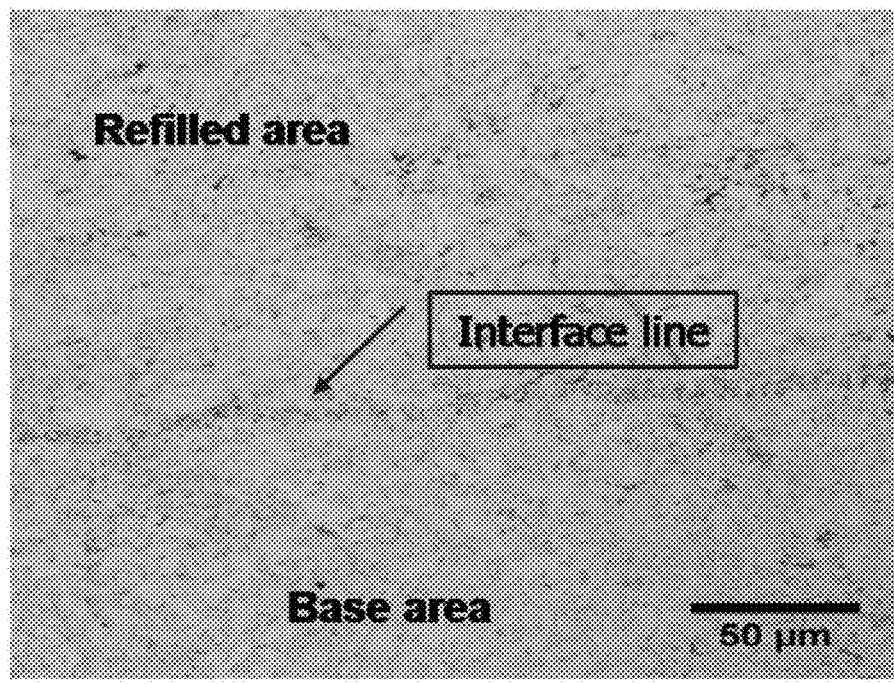
Figure 8:
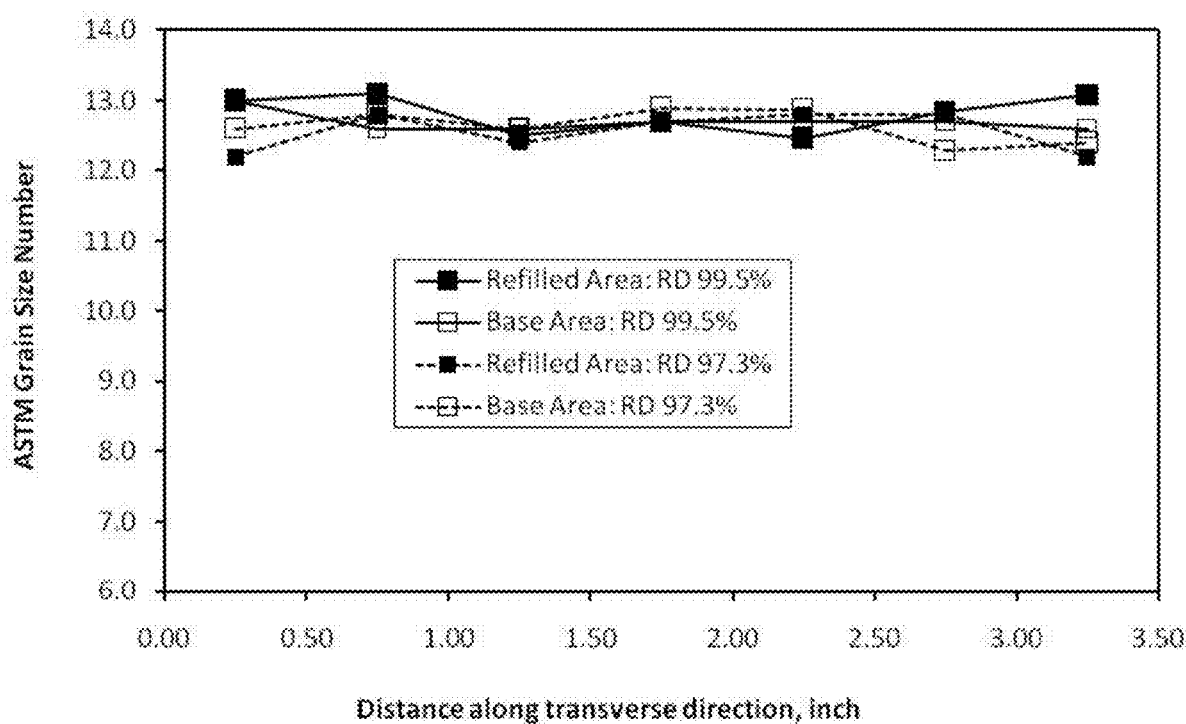
FIG. 8 is a plot of ASTM grain size distribution in different locations along a transverse direction of the refurbished sputtering targets of FIG. 7A and FIG. 7B.
Figure 9A:
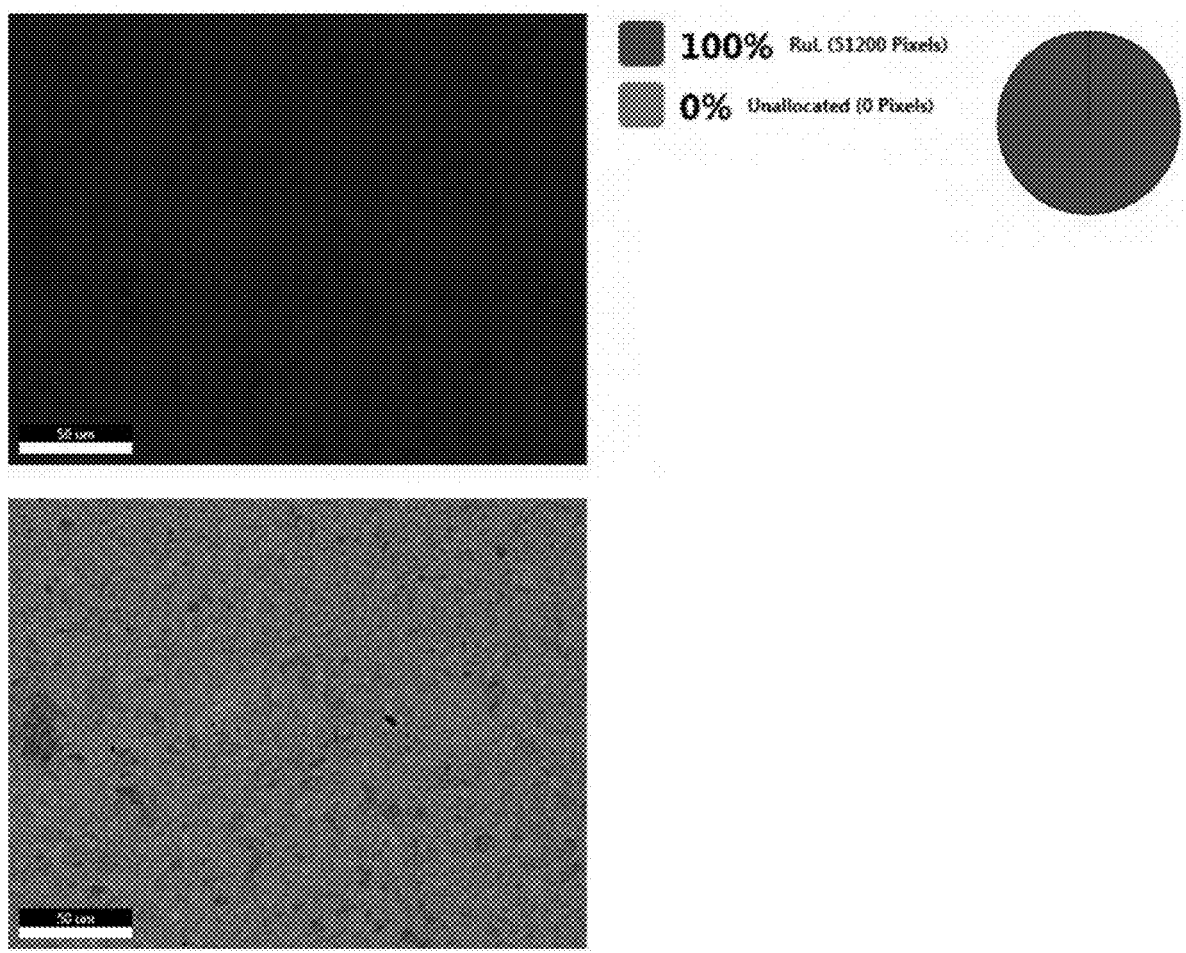
FIG. 9A is an SEM image (top) and corresponding EDX elemental mapping (bottom) of a cross section sample from a refurbished sputtering target with RD of 99.5%.
Figure 9B:
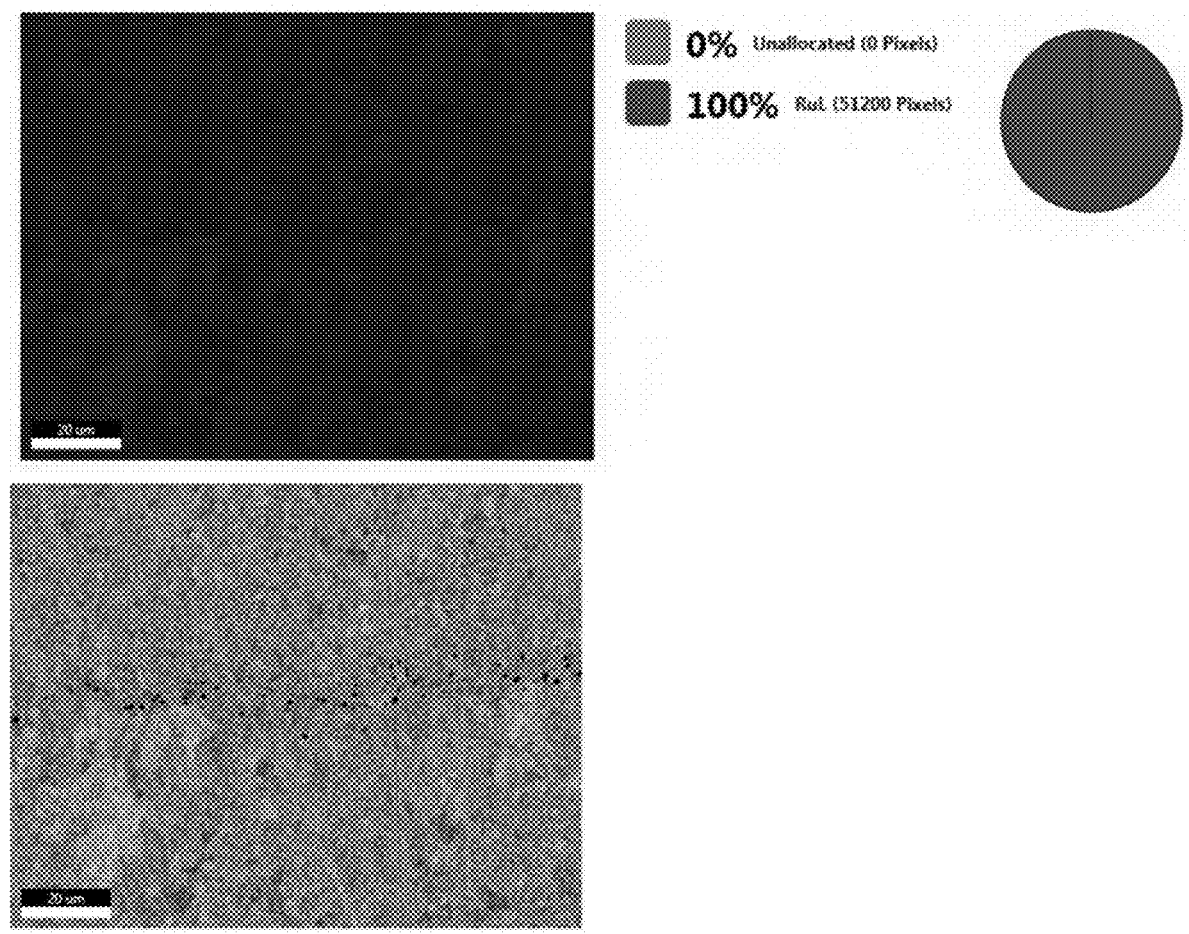
FIG. 9B is an SEM image (top) and corresponding EDX elemental mapping (bottom) of a cross section sample from a refurbished sputtering target with RD of 97.3%.

FIG. 7A and FIG. 7B are micrographs showing the optical microstructures of cross-section samples from refurbished sputtering targets with a relative density (RD) of 99.5% and 97.3%, respectively. As seen in the micrographs, both the refilled and base areas of the two samples show identical fine grain structure with ASTM grain size of 12-13 (3-4 µm). The interface line between the refilled area and the base area is visible with some discrete voids. It appears that the sample from the refurbished target with RD of 97.3% has slightly more voids in the interface area than the sample from the refurbished target with RD of 99.5%. FIG. 8 plots the grain size distribution along the target width, indicating homogeneous grains with ASTM size numbers of 12-13 (3-4 µm) were formed throughout the transverse direction for both samples from the refurbished targets with RD of 99.5 and 97.3%. FIG. 9A and FIG. 9B present the results of SEM images of the cross-section microstructure (top) and corresponding EDX elementary mapping (bottom for both samples, indicating no significant impurities were detected in the mapping area at EDX resolutions.

Figure 10:
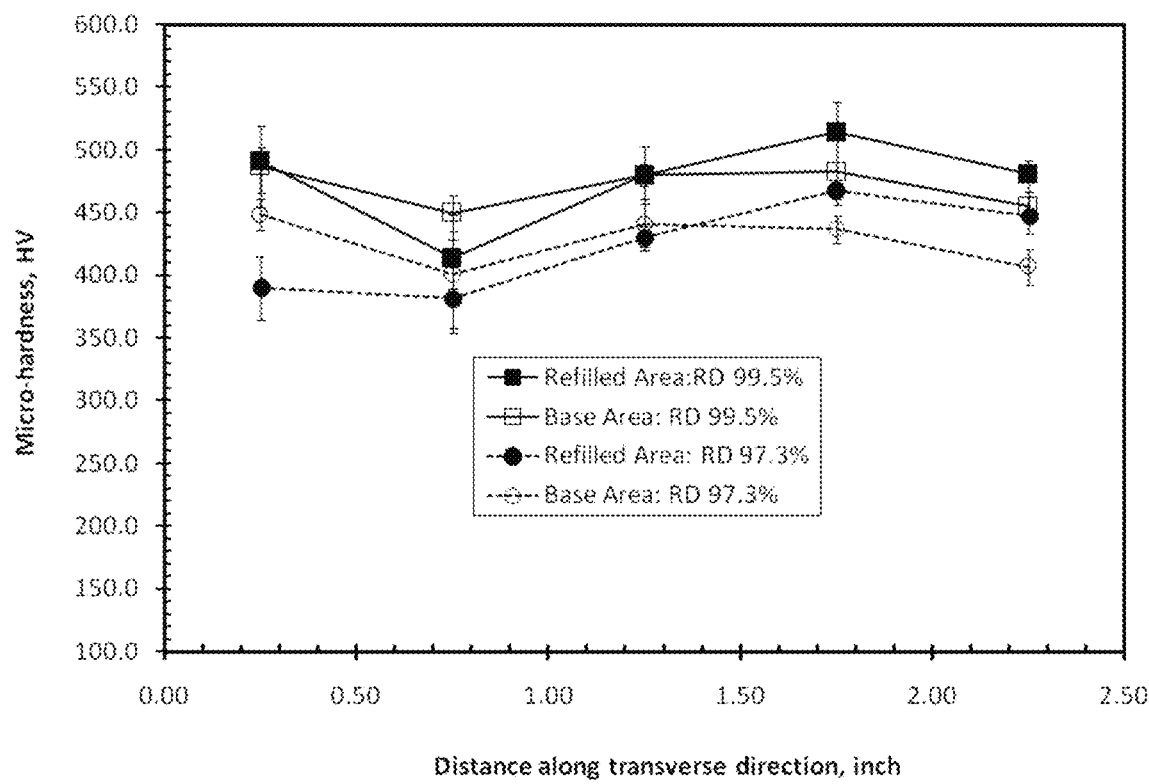
FIG. 10 is a plot of micro-hardness distribution along a transverse direction of the refurbished sputtering targets of FIG. 7A and FIG. 7B.

Micro-hardness measurement on the cross-section surface along the transverse direction was also conducted on the refurbished sputtering targets. FIG. 10 shows the micro-hardness distribution in both the refilled and base areas along the transverse direction of both targets, indicating that slightly higher micro-hardness values in the refilled and base areas were observed in the refurbished sputtering target with RD of 99.5%. For each target, both refilled and base areas have comparable values of micro-hardness throughout the width of the target. It was suggested that micro-hardness is associated with density and microstructure.

Figure 11:
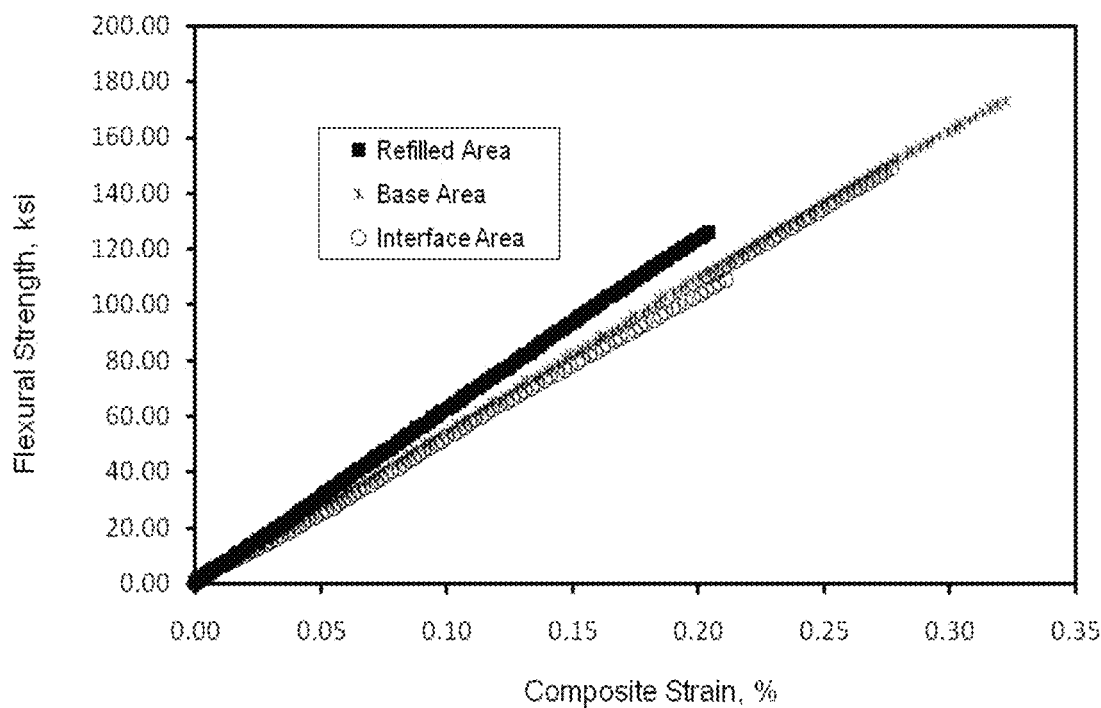
FIG. 11 is a plot showing exemplary curves of flexural strength measurement for specimens from a refurbished sputtering target.
Figure 12:
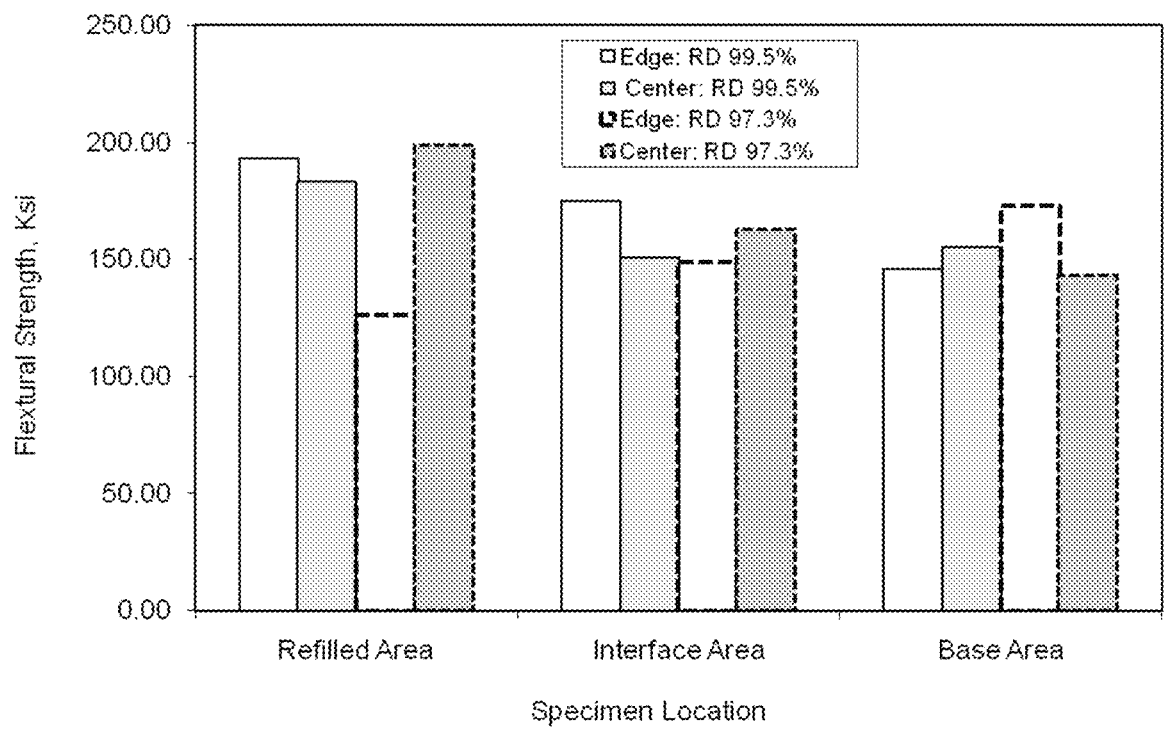
FIG. 12 summarizes the results of flexural strength measurement for specimens in different locations of the refurbished sputtering targets of FIG. 7A and FIG. 7B.

The flexural strength of the refurbished sputtering targets with RD of 97.3% and 99.5% was measured following ASTM 790-10 to examine the bonding strength. The specimen for flexural strength measurement was EDM (electric discharge machining) cut from a refurbished sputtering target along the transverse direction with a width of 0.75 inches and length of 3.5 inches. Three specimens were sliced using EDM along the thickness from the base area, interface, and refilled area, respectively. FIG. 11 shows the curves of stress as a function of composite strain from flexural strength measurement of specimens from the refurbished target with RD of 97.3%. High strength and low strain was observed, suggesting fracture behavior of the testing specimens. The flexural strength in all three areas (refilled, interface and base areas) was comparable. FIG. 12 presents a summary of all testing results, indicating that the flexural strength of the refurbished sputtering targets is substantially identical in the base and refilled areas regardless of relative density. The flexural strength of the interface area of the target with RD of 99.5% is slightly higher than that of the target with RD of 97.3%.

Example 2

Raw ruthenium powder was baked, sieved and stored for subsequent hot pressing use. A non-circular spent target with rectangular shape as seen in FIG. 2 was mechanically cleaned via dremel grinding, orbital sanding, methanol wiping, dry ice blasting, and a hot air gun. After mechanical cleaning, the spent target was loaded into the cavity following the procedure described in step 112 of FIG. 1, and then the baked powder was loaded into the cavity to fill the gaps and depleted regions of the spent sputtering target, and the powder was then leveled. Hot pressing was conducted following the procedure described in step 116 of FIG. 1 to sinter the powder and the spent target together, thereby forming a new, refurbished sputtering target. In general, after hot pressing, the spent target should be bonded via the disclosed sintering mechanism to form a refurbished target having a relative density of at least 95%. The refurbished target was then machined to obtain a target. The refurbished spent target achieved a relative density of about 97% without visible defects such as cracks, de-laminating, porosity, etc.

Figure 13:
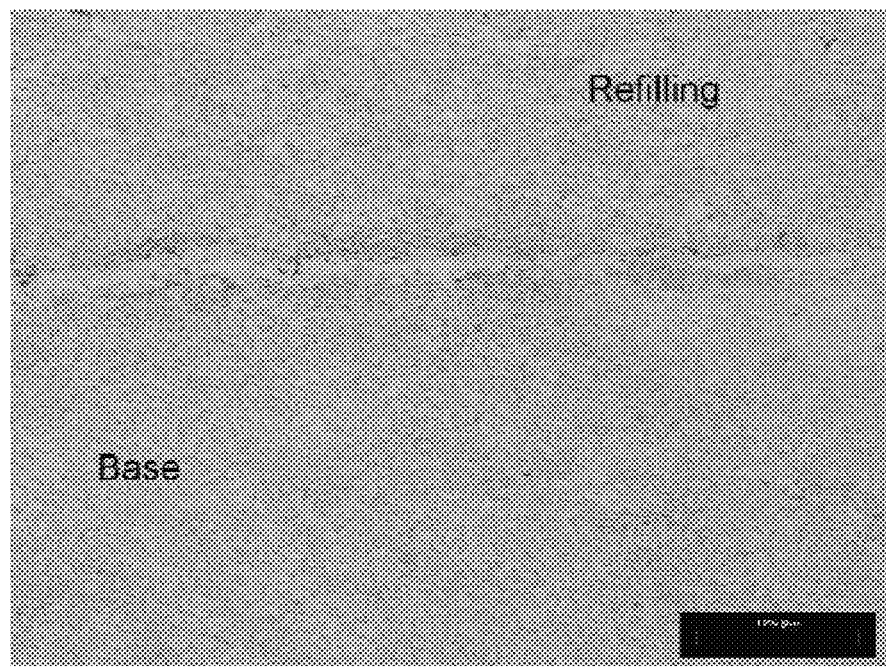
FIG. 13 is an optical microstructure micrograph of a cross-section sample from the base area, interface, and refilled area of a refurbished ruthenium sputtering target (process-B target).
Figure 14A:
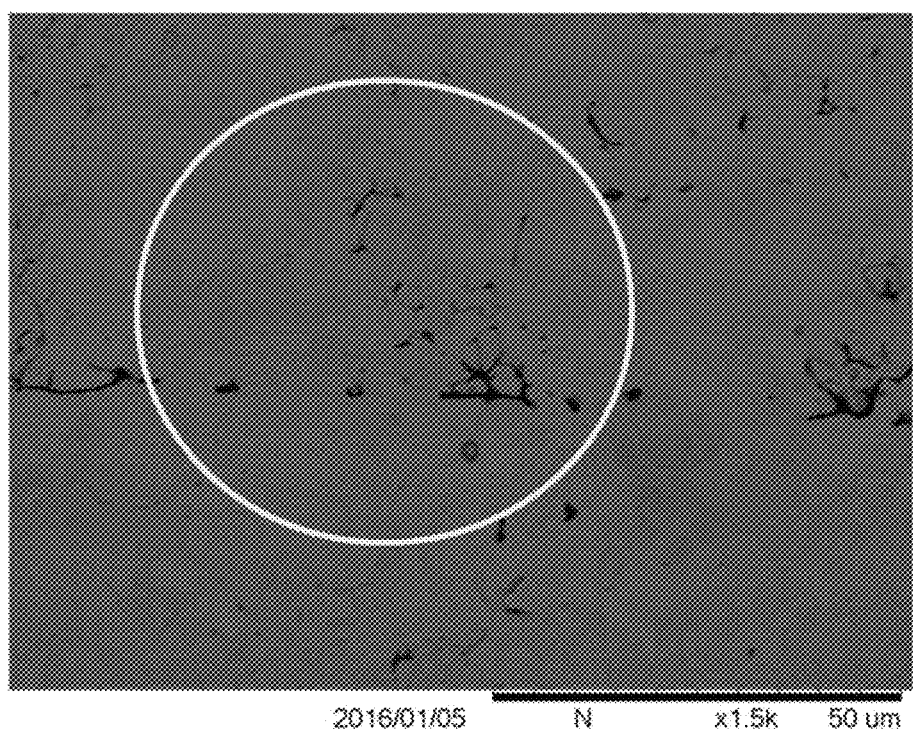
FIG. 14A is an SEM image (top) and FIG. 14B is a corresponding EDX elemental mapping (bottom) of a cross section sample from a refurbished ruthenium sputtering target.
Figure 14B:
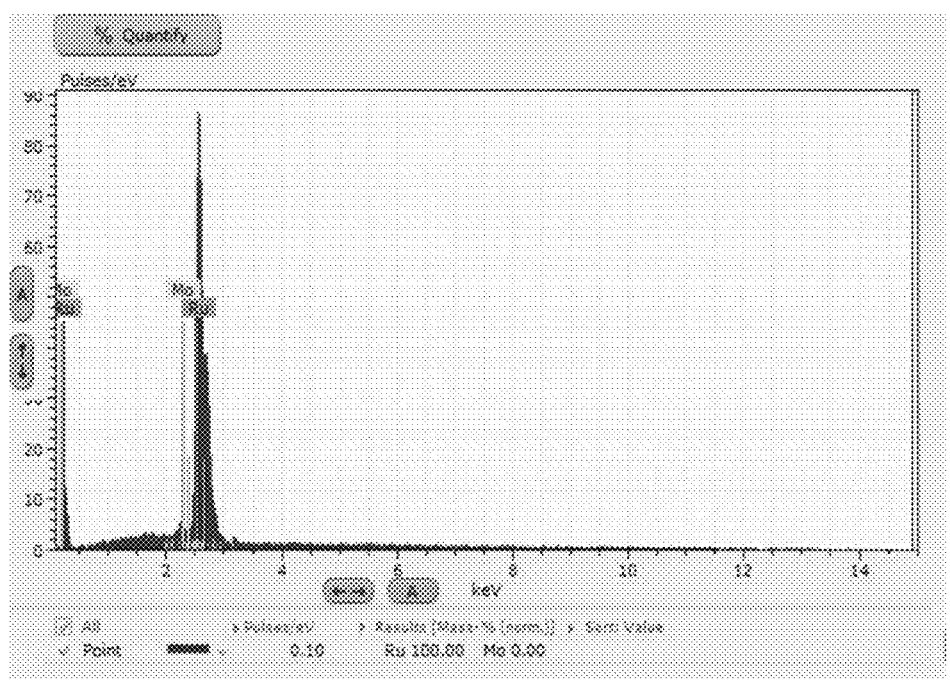

The refurbished target was cut along the transverse direction by electrical discharge machining (EDM) to obtain a sample having cross-sectional dimensions of 10 mm long, 12 mm high, and 10 mm thick in order to examine the microstructure of the refurbished target. The microstructure was examined using an optical microscope and scanning electron microscopy and energy dispersive X-ray spectroscopy (SEM/EDX) as shown in FIG. 13 and FIGS. 14A-14B, respectively. As can be seen in FIG. 13, the refurbished target has a homogeneous grain size in both the base and refilling area, as well as the interface area with minimized porosity. Both the refilled and base area have an average ASTM grain size of 12 (~4.5 µm). The SEM/EDX examination in FIGS. 14A-14B shows that pure Ru content was detected at the EDX resolution of the interface area. Peak noise of Mo was also detected at the EDX resolution of the interface area. Accordingly, FIGS. 14A-14B suggest that the mechanical cleaning process could significantly remove the contamination.

Figure 15:
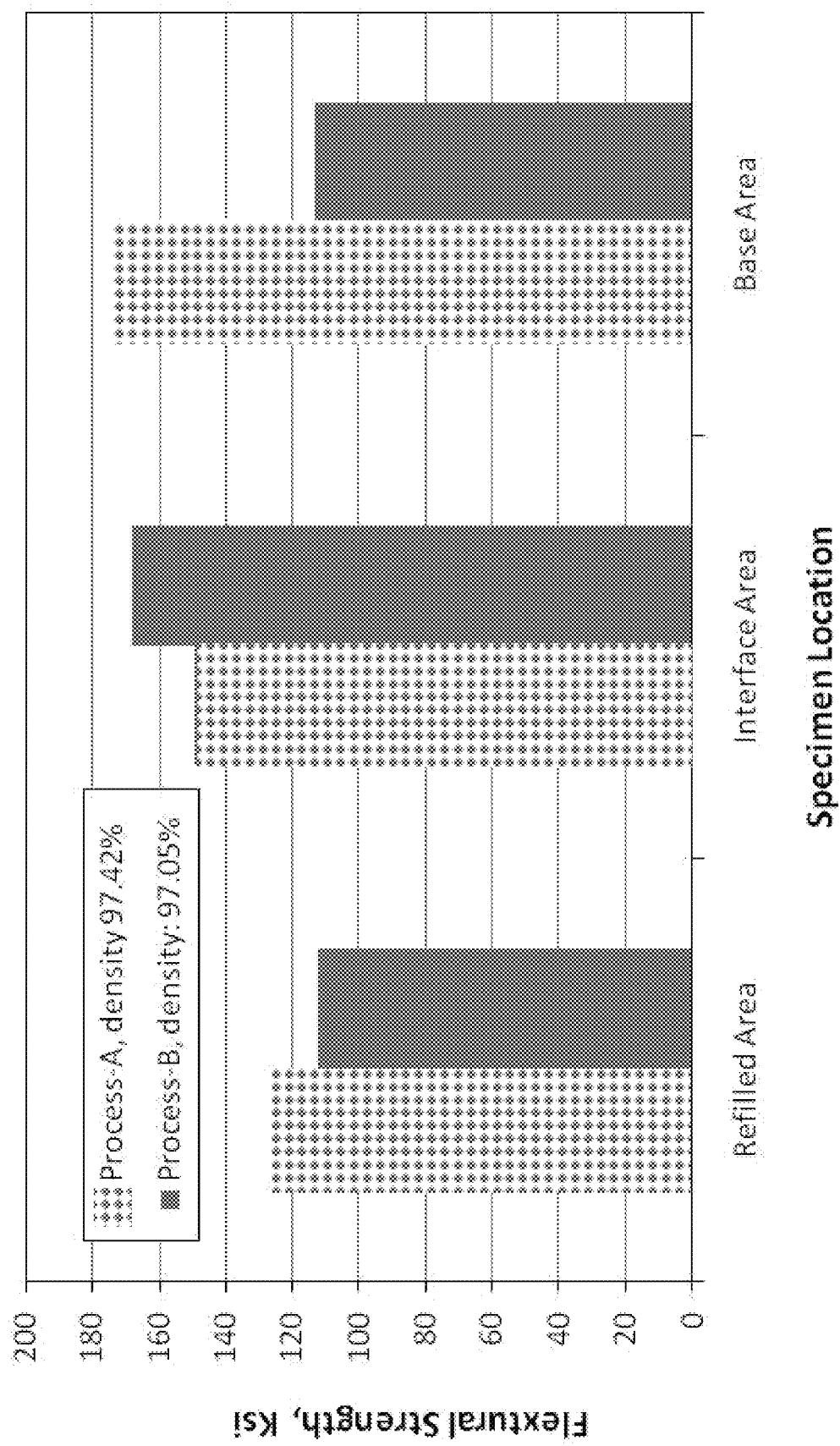
FIG. 15 summarizes the results of flexural strength measurement for specimens in different locations of a refurbished ruthenium sputtering target.

The refurbished target was mechanically evaluated. Data of Example 1 (named as the "Process-A" target) was used for comparing the flexure strength to the refurbished target of Example 2 (named as the "Process-B" target). The flexural strength of the refurbished sputtering targets was measured using the three-point-bending method following ASTM D790-10 to examine the bonding strength. The specimens for flexural strength measurement were cut by electrical discharge machining (EDM) to dimensions of 10 mm long, 12 mm high, and 10 mm thick. FIG. 15 shows the flexure strength of the specimens from different locations on the Process-A and Process-B refurbished targets. The plot of FIG. 15 suggests that the Process-A and Process-B refurbished targets have comparable relative densities and flexure strength in the refilling, interface and base area.

SPC (statistical process capability) of density was determined using data from 25 refurbished sputtering targets. The Cpk value was 2.39, suggesting the process is stably capable.

It will be appreciated that variants of the above-disclosed components, processes, and apparatuses and other features and functions, or alternatives thereof, may be combined into many other different systems or applications. Various presently unforeseen or unanticipated alternatives, modifications, variations or improvements therein may be subsequently made by those skilled in the art, which are also intended to be encompassed by the following claims.

The invention claimed is:

1. A process for refurbishing a non-circular spent sputtering target, comprising:
    receiving a non-circular spent sputtering target having a depleted region on a sputtering surface and a back surface opposite the depleted region;
    preparing a hot press die having a bottom wall and a die wall surrounding a cavity capable of accommodating the spent sputtering target;
    centering the spent sputtering target within the cavity of the hot press die to accommodate anisotropic thermal expansion using at least one spacer placed between the spent sputtering target and the die wall, a sidewall of the at least one spacer directly engaging the sputtering target and one end of the at least one spacer directly engaging the bottom wall;
    filling the depleted region of the spent sputtering target and the gaps between the spent sputtering target and the die wall with a metal powder;
    removing the at least one spacer to create a spacer gap;
    filling the spacer gap with the metal powder to produce a powder-filled sputtering target; and
    applying sufficient heat and force to a top surface of the powder-filled spent sputtering target while maintaining the temperature below that of the melting point of the metal to consolidate the metal powder together with the spent sputtering target through a solid state diffusion process, thus producing a refurbished sputtering target.

2. The process of claim 1, further comprising cleaning the sputtering surface of the spent sputtering target before centering the spent sputtering target within the cavity of the hot press die, wherein a reactive gas at elevated temperatures is used to clean the sputtering surface of the spent sputtering target.

3. The process of claim 1, wherein the cavity of the hot press die is circular, and further comprising placing insert pieces within the cavity of the hot press die to change the perimeter of the cavity into a non-circular shape corresponding to the shape of the spent sputtering target.

4. The process of claim 3, wherein each insert piece comprises a curved sidewall and a linear sidewall.

5. The process of claim 1, further comprising placing a foil between the spent sputtering target and the bottom wall of the hot press die, or placing a foil upon a top surface of the filled sputtering target.

6. The process of claim 1, wherein (i) the metal powder is a metal selected from the precious metal group consisting of platinum, rhodium, and ruthenium, or (ii) the metal powder includes an alloy of at least two different metals, at least one of which is selected from, platinum, rhodium, and ruthenium.

7. The process of claim 1, wherein a uniaxial force is applied to the top surface of the powder-filled sputtering target using a top punch.

8. The process of claim 1, wherein the step of applying sufficient heat and force is performed for a time period sufficient to sinter the metal powder and form a solid state diffusion bond with the spent sputtering target, with a similar microstructure at the interface between the spent sputtering target and the sintered metal powder as found elsewhere in the refurbished sputtering target.

9. The process of claim 1, wherein a heat from about 1300° C. to about 1550° C. and a uniaxial force of from about 10 MPa to about 40 MPa is applied in a direction perpendicular to the top surface of the filled sputtering target.

10. The process of claim 1, wherein a plurality of spacers are used to center the spent sputtering target within the cavity.

11. The process of claim 1, further comprising cleaning the sputtering surface of the spent sputtering target before centering the spent sputtering target within the cavity of the hot press die, wherein the spent sputtering target is cleaned by grinding, sanding, wiping, dry ice blasting, or hot air gun drying.

12. A process for refurbishing a non-circular spent sputtering target, comprising:
    receiving a non-circular spent sputtering target having a depleted region on a sputtering surface and a back surface opposite the depleted region;
    preparing a hot press die having a bottom wall and a die wall surrounding a rectangular cavity capable of accommodating the spent sputtering target;
    centering the spent sputtering target within the cavity of the hot press die to accommodate anisotropic thermal expansion using a spacer placed at each corner of the rectangular cavity between the spent sputtering target and the die wall, one end of each spacer directly engaging the bottom wall, wherein each spacer is formed from a sidewall having a constant thickness and including a right angle;
    filling the depleted region of the spent sputtering target and the gaps between the spent sputtering target and the die wall with a metal powder;
    removing the plurality of spacers to create a spacer gap;
    filling the spacer gap with the metal powder to produce a powder-filled sputtering target; and
    performing hot pressing by applying sufficient heat and force to a top surface of the powder-filled spent sputtering target using a top punch while maintaining the temperature below that of the melting point of the metal to consolidate the metal powder together with the spent sputtering target through a solid state diffusion process, thus producing a refurbished sputtering target.

\* \* \* \* \*